(12) United States Patent
Yao et al.

(10) Patent No.: US 9,024,315 B2
(45) Date of Patent: May 5, 2015

(54) DAISY CHAIN CONNECTION FOR TESTING CONTINUITY IN A SEMICONDUCTOR DIE

(71) Applicant: QUALCOMM Incorporated, San Diego, CA (US)

(72) Inventors: Hongjun Yao, San Diego, CA (US); Michael Laisne, Encinitas, CA (US); Matthew M Nowak, San Diego, CA (US); Glen T Kim, San Diego, CA (US); Mark C Chan, San Diego, CA (US); Shiqun Gu, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 4 days.

(21) Appl. No.: 13/800,976

(22) Filed: Mar. 13, 2013

(65) Prior Publication Data
US 2014/0264331 A1  Sep. 18, 2014

(51) Int. Cl.
*H01L 23/58* (2006.01)
*H01L 21/66* (2006.01)

(52) U.S. Cl.
CPC ........... *H01L 22/32* (2013.01); *H01L 22/14* (2013.01); *H01L 2924/0002* (2013.01); *H01L 2224/16* (2013.01); *H01L 2924/15311* (2013.01)

(58) Field of Classification Search
CPC ....... H01L 24/01; H01L 24/02; H01L 23/528; H01L 22/32; H01L 22/14

USPC ........ 257/48, E23.001, E23.002; 324/762.01, 324/762.02, 462.03
See application file for complete search history.

(56) References Cited

U.S. PATENT DOCUMENTS

| | | | |
|---|---|---|---|
| 8,120,356 B2 | 2/2012 | Agarwal et al. | |
| 2008/0018350 A1* | 1/2008 | Chao et al. | 324/754 |
| 2012/0007626 A1* | 1/2012 | Eldridge | 324/756.03 |
| 2012/0012841 A1 | 1/2012 | Chang et al. | |
| 2012/0097944 A1 | 4/2012 | Lin et al. | |
| 2012/0242357 A1 | 9/2012 | Eccles | |

* cited by examiner

Primary Examiner — Benjamin Sandvik
Assistant Examiner — Farid Khan
(74) Attorney, Agent, or Firm — Fountainhead Law Group P.C.

(57) ABSTRACT

An integrated circuit product package configured to continuity testing is described. The integrated circuit product package includes a package substrate. The package substrate includes internal routing connections. The integrated circuit product package also includes a semiconductor die coupled to the package substrate. The semiconductor die includes input/output (I/O) pins and switches. The switches selectively coupled the I/O pins to facilitate a daisy chain connection. The daisy chain connection includes circuitry fabricated on the semiconductor die, more than two of the internal routing connections, more than two of the I/O pins and at least one switch.

42 Claims, 10 Drawing Sheets

DAISY CHAIN CONNECTION FOR TESTING CONTINUITY IN A SEMICONDUCTOR DIE

TECHNICAL FIELD

The present disclosure relates generally to continuity tests in an electronic device. More specifically, the present disclosure relates to a daisy chain connection for testing continuity in a die.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

As electronic and wireless devices become more advanced, the complexity of circuitry has increased. Further, the amount of space available for circuitry has decreased. Attempts to combine or consolidate components on a single circuit within a wireless device may result in a larger footprint on the circuit, and may include additional considerations for functionality.

Furthermore, testing circuit functionality in electronic and wireless devices has also become more complex. With more circuitry being contained within a smaller area, testing procedures have become more extensive. Benefits may be realized by improvements to electronic devices that allow complex circuitry to be tested in convenient ways.

SUMMARY

An integrated circuit product package configured for continuity testing is described. The integrated circuit product package includes a package substrate. The package substrate includes internal routing connections. The integrated circuit product package also includes a semiconductor die coupled to the package substrate. The semiconductor die includes input/output (I/O) pins and switches. The switches selectively couple the I/O pins to facilitate a daisy chain connection. The daisy chain connection includes circuitry fabricated on the semiconductor die, more than two of the internal routing connections, more than two of the I/O pins and at least one switch.

The package substrate and the semiconductor die may be coupled together using die interconnects. The daisy chain connection may also include more than two of the die interconnects. The package substrate may also include substrate interconnects on a different surface of the package substrate than the die interconnects. The daisy chain connection may further include at least two of the substrate interconnects.

A top printed circuit board (PCB) may be coupled to the integrated circuit product package. The daisy chain connection may further include components on the top PCB. The top PCB may also be coupled to the semiconductor die using the internal routing connections. The top PCB may also be coupled to the package substrate using test probes. The test probes may be spring probes.

The integrated circuit product package may further include a second semiconductor die coupled to the package substrate. The second semiconductor die may include I/O pins and switches. The daisy chain connection may further include circuitry fabricated on the second semiconductor die, I/O pins on the second semiconductor die and at least one switch on the second semiconductor die. The second semiconductor die may be coupled to the semiconductor die using internal routing connections internal to the integrated circuit product package.

The integrated circuit product package may be coupled to a loadboard using test probes. The test probes may be spring probes. The test probes may be coupled together using a loadboard contact. The daisy chain connection may further include the test probes and the loadboard contact. The test probes may also be coupled together using multiple loadboard contacts. The daisy chain connection may further include the test probes and the multiple loadboard contacts. The multiple loadboard contacts may be connected using internal routing on the loadboard.

The daisy chain connection may further include each of the I/O pins on the semiconductor die. Additionally, the switches may selectively couple the I/O pins to facilitate multiple daisy chain connections. Each daisy chain connection may include circuitry fabricated on the semiconductor die, more than two of the internal routing connections, more than two of the I/O pins and at least one switch. Each adjacent I/O pin may be part of a different daisy chain connection.

The switches may selectively couple the I/O pins to facilitate at least two daisy chain connections. Each of the two daisy chain connections may include circuitry fabricated on the semiconductor die, more than two of the internal routing connections, more than two of the I/O pins and at least one switch. Each adjacent I/O pin may be part of a different daisy chain connection. Further, the I/O pins may be coupled together unto groups of I/O pins using one or more transistors on the semiconductor die. Each of the groups of I/O pins may include two or more I/O pins and switches for selectively shorting or disconnecting the two or more of the I/O pins within each group of I/O pins.

A method for generating an integrated circuit product package configured for continuity testing is also described. The method includes obtaining a package substrate. The package substrate includes internal routing connections. The method also includes obtaining a semiconductor die. The semiconductor die includes I/O pins and switches. The method also includes coupling the package substrate to the semiconductor die using die interconnects. The method also includes selectively coupling the I/O pins to facilitate a daisy chain connection. The daisy chain connection includes circuitry fabricated on the semiconductor die, more than two of the internal routing connections, more than two of the die interconnects, more than two of the I/O pins and at least one switch.

An apparatus for generating an integrated circuit product package configured for continuity testing is also described. The apparatus includes a package substrate. The package substrate includes internal routing connections. The apparatus also includes a semiconductor die coupled to the package substrate. The semiconductor die includes I/O pins. The apparatus also includes means for selectively coupling the input/output pins to facilitate a daisy chain connection. The daisy chain connection includes circuitry fabricated on the semiconductor die, more than two of the internal routing connections and more than two of the I/O pins.

DETAILED DESCRIPTION

Figure 1:
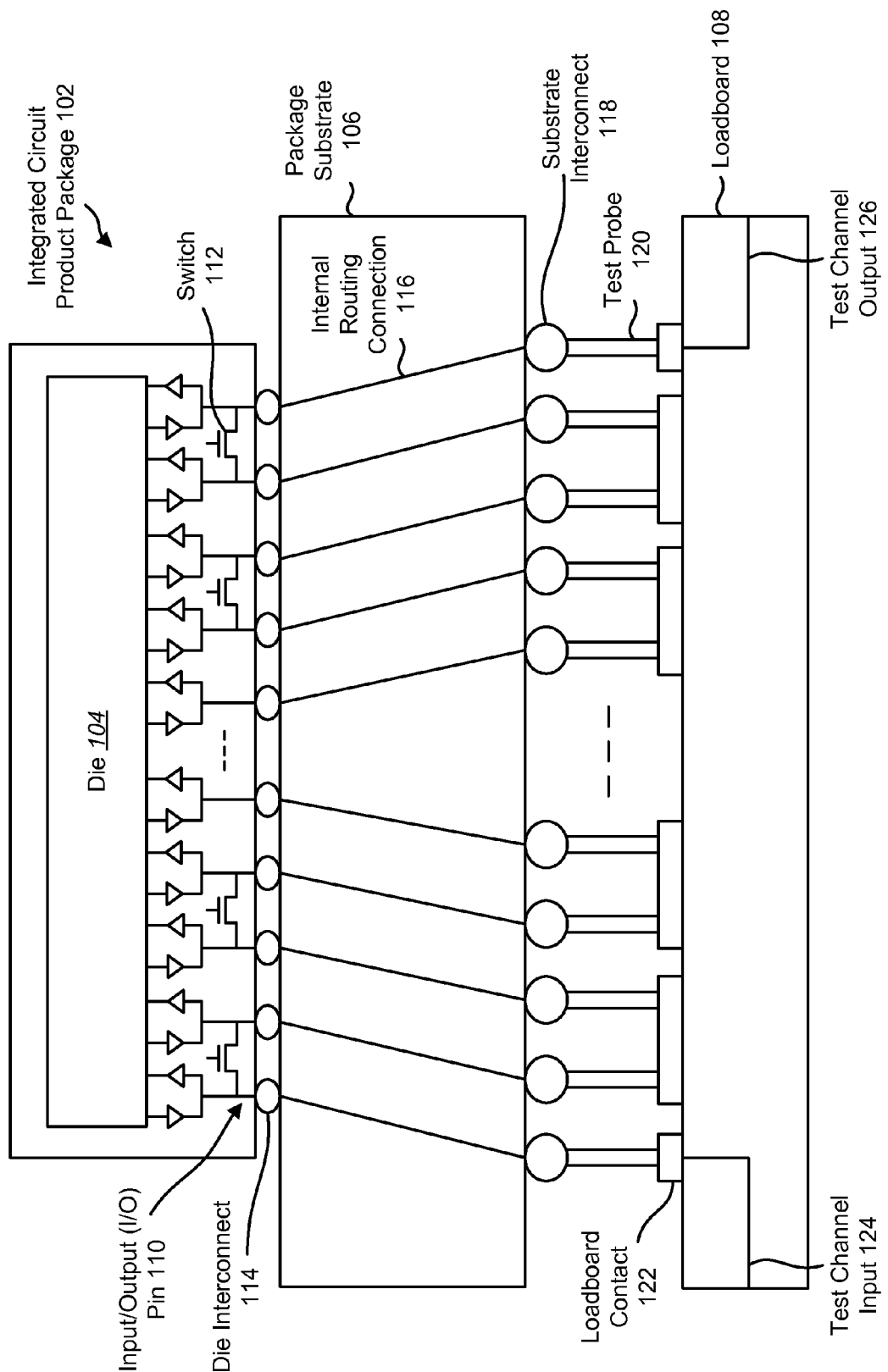
FIG. 1 illustrates one configuration of a system for testing continuity of circuitry fabricated on a semiconductor die.

FIG. 1 illustrates one configuration of a system for testing continuity of circuitry fabricated on a semiconductor die. The system includes an integrated circuit product package 102, which may include a die 104 and a package substrate 106. The integrated circuit product package 102 may be coupled to a loadboard 108 for testing continuity of the die circuitry that is fabricated on the die 104. The integrated circuit product package 102 may be configured to be used in an electronic device, which may be a wireless device.

Circuitry may be fabricated on the die 104. Further, the die 104 may include input/output (I/O) pins 110 coupled to circuitry on the die 104. The system shown in FIG. 1 may be used for testing continuity of the die circuitry and other connections on the die 104. For example, the system may be implemented in an automatic test equipment (ATE) environment, which is part of the production process for semiconductor devices. The system may be utilized for testing the continuity of one or more devices under test (DUTs). A device under test (DUT) may include a die 104. By connecting I/O pins 110 of a die 104 to a test channel, the continuity of circuitry on the die 104 associated with each of the I/O pins 110 may be tested. Moreover, as used herein, die circuitry may refer to any circuitry implemented on a die 104, including switches 112, I/O pins 110 and other circuitry described herein.

The I/O pins 110 may be coupled together by one or more switches 112. In some configurations, switches 112 may be selectively used to connect adjacent I/O pins 110, for reasons that will be explained below. The switches 112 may be configured to connect two or more I/O pins 110 or switched off for disconnecting I/O pins 110. In some configurations, the switches 112 may be analog switches. Further, the switches 112 may include one or more transistors. In one configuration, a switch 112 containing a transistor may be controlled using a voltage control signal applied to a gate of the transistor. Using the voltage control, the switch 112 may be turned on or off to connect or disconnect one or more I/O pins 110.

Each of the I/O pins 110 may be coupled to a corresponding die interconnect 114. The die interconnects 114 may be used to connect the die 104 to the package substrate 106. In general, each die interconnect 114 corresponds to a different I/O pin 110. The die interconnects 114 may also provide an electrical connection between one or more components on the die 104 (e.g., die circuitry, switches 112, I/O pins 110) and one or more internal routing connections 116 in the package substrate 106. The die interconnects 114 may be physically connected to a surface of the die 104. Further, the die interconnects 114 may be made from a variety of materials. In one configuration, the die interconnects 114 may be solder balls or solder pads for connecting the die 104 and the package substrate 106. Alternatively, the die interconnects 114 may be implemented using vias or other technologies for connecting and/or providing an electrical connection between the die 104 and the package substrate 106. For example, the system may be implemented using flip chip assembly, wire bond or through silicon via (TSV) technology.

A first surface of the package substrate 106 may be connected to the die 104 by the die interconnects 114. The package substrate 106 may be made from a variety of materials. Examples of materials or substrates that may be used for implementing the package substrate 106 may include a printed circuit board (PCB), ceramic substrates, extended wafer level packaging technologies or other suitable material for supplying internal routing connections 116 between different surfaces of the package substrate 106. The package substrate 106 may also include multiple internal routing connections 116 coupled to one or more I/O pins 110 via the die interconnects 114.

The internal routing connections 116 in the package substrate 106 may pass between a first surface of the package substrate 106 and a second surface of the package substrate 106. An internal routing connection 116 may be an electrical channel for passing an electrical signal through the package substrate 106. Each internal routing connection may be coupled to an I/O pin 110 via a corresponding die interconnect 114. For example, a first internal routing connection 116 may be coupled to a first die interconnect 114 and corresponding I/O pin 110 while a second internal routing connection 116 may be coupled to a second die interconnect 114 and different corresponding I/O pin 110.

The package substrate 106 may include substrate interconnects 118 on a second surface of the package substrate 106. The substrate interconnects 118 may be coupled to one or more die interconnects 114 by internal routing connections 116 passing between the first and second surface of the package substrate 106. Each of the substrate interconnects 118 may correspond to a different internal routing connection 116. The substrate interconnects 118 may use similar or different materials as the die interconnects 114 on the first surface of the package substrate 106. In one configuration, the substrate interconnects 118 and die interconnects 114 may be solder balls or other material for connecting the package substrate 106 to the die 104 or loadboard 108. Further, the solder balls used as the substrate interconnects 118 may be larger than the solder balls used as the die interconnects 114. In one example, the solder balls used as substrate interconnects 118 may have a 0.4-0.5 mm pitch.

A loadboard 108 may be coupled to the integrated circuit product package 102. The loadboard 108 may be used for testing continuity of circuitry on the die 104. The loadboard 108 may include loadboard contacts 122. The loadboard 108 may also include internal routing for coupling one or more loadboard contacts 122 to other circuitry on the loadboard 108. The loadboard 108 may be made from a variety of materials. In one configuration, the loadboard 108 may be a printed circuit board (PCB).

The loadboard 108 may be coupled to the integrated circuit product package 102 via multiple test probes 120. Each of the test probes 120 may be housed within a test socket on the loadboard 108. When the integrated circuit product package 102 comes into contact with the test probes 120, each of the substrate interconnects 118 may form an electrical connection with the test probes 120 on the loadboard 108. The test probes 120 may be used to couple each of the substrate interconnects 118 to one or more loadboard contacts 122. Connecting the integrated circuit product package 102 to the loadboard 108 in an automatic test equipment (ATE) environment may enable testing the continuity of circuitry on the die 104. In some configurations, the test probes 120 may include spring probes. Each spring probe may be housed within one of the test sockets on the loadboard 108. When the integrated circuit product package 102 is placed in contact with the spring probes, the spring probes may compress and form an electrical connection between the substrate interconnects 118 and the loadboard contacts 122.

Each of the test probes 120 may be coupled to the loadboard 108 by loadboard contacts 122. Some of the test probes 120 may be coupled together by a single loadboard contact 122 on the surface of the loadboard 108. One or more loadboard contacts 122 may be used to couple two adjacent test probes 120 on the surface of the loadboard 108. Alternatively, one or more loadboard contacts 122 may also be used to couple non-adjacent test probes 120 together using connections or internal traces on the loadboard 108. Further, each loadboard contact 122 may be coupled or electrically connected to any other component on the loadboard 108 through internal traces inside the loadboard 108. Thus, multiple loadboard contacts 122 need not necessarily be adjacent to each other, as shown in the example of FIG. 1. Where a loadboard contact 122 connects two test probes 120, the two test probes 120 and loadboard contact 122 may create a single electrical path for passing a signal through each of the test probes 120. In one example, a loadboard contact 122 may be shared by a first test probe 120 and a second test probe 120. The first test probe 120 may be electrically connected to the second test probe 120 by the loadboard contact 122 shared by the first test probe 120 and the second test probe 120.

The integrated circuit product package 102 may implement one or more daisy chains. A daisy chain may include multiple components coupled together to form a continuous chain of components. An example of a daisy chain may include internal routing connections 116, I/O pins 110, switches 112 and circuitry on the die 104. Each of the components that make up the daisy chain may be coupled together to form a single electrical path of components. A test channel may be generated using a daisy chain by passing an electrical signal from a first end of the daisy chain to a second end of the daisy chain. Therefore, each device under test (DUT) included within a daisy chain may be tested for continuity using a single test channel.

In one configuration, a first end of a daisy chain may begin at a test channel input 124 coupled to a first loadboard contact 122. The daisy chain may continue sequentially through a first test probe 120, a first substrate interconnect 118, a first internal routing connection 116, a first die interconnect 114 and into the die 104 through a first I/O pin 110. The same daisy chain may continue through a switch 112 connecting the first I/O pin 110 and an adjacent second I/O pin 110. Passing through the switch 112, the daisy chain may continue through the second I/O pin 110, a second die interconnect 114, a second internal routing connection 116, a second substrate interconnect 118, a second test probe 120 and a second loadboard contact 122 coupling the second test probe 120 to a third test probe 120. The daisy chain may continue through additional components on the integrated circuit product package 102 and loadboard 108. The daisy chain may continue to pass through each of the loadboard contacts 122, test probes 120, substrate interconnects 118, internal routing channels 116, die interconnects 114, I/O pins 110 and switches 112 on an integrated circuit product package 102. A second end of the daisy chain may pass through a loadboard contact 122 into a test channel output 126 in the loadboard 108. An electrical signal applied to the test channel input 124 may be configured to pass through each component on the daisy chain and be output at the test channel output 126.

By configuring the switches 112 and loadboard contacts 122 to couple each of the I/O pins 110 together into a single electrical path, a daisy chain may be generated that extends through each of the I/O pins 110 on the die 104. In some configurations, each of the I/O pins 110 may be included in one continuous daisy chain. A test channel may be formed using the daisy chain by connecting a first end of the daisy chain to a test channel input 124 and a second end of the daisy chain to a test channel output 126. The continuity of the circuitry on the daisy chain may be tested by applying an electrical signal to one end of the test channel and measuring a resistance, voltage, current or other measurement on the test channel as a signal passes through the daisy chain. The continuity of each of the components on the daisy chain, including the die 104, may be determined through observation of the signal that passes through the test channel.

In some configurations, multiple daisy chains may be used for testing continuity of a die 104. For example, multiple daisy chains may be formed for a device under test (DUT) for testing continuity of different portions of circuitry. By using multiple daisy chains, the location of any continuity fails may be precisely detected.

By implementing a daisy chain that passes through each I/O pin 110 on the die 104, circuitry that may be used on the loadboard 108 for determining continuity of a die 104 may be reduced in complexity as a result of one or more daisy chains reducing the number of signals to be processed. For example, by using daisy chains to test the continuity of one or more devices under test (DUTs), the continuity of circuitry on the die 104 may be determined without the use of a multiplexer (MUX) on the loadboard 108 or with using a fewer number of MUXes on the loadboard 108. Simplified test circuitry on the loadboard 108 may allow for additional DUTs to be placed into a loadboard 108 without increasing the test resources in the ATE environment as fewer connections and circuitry are needed to run tests.

Figure 2:
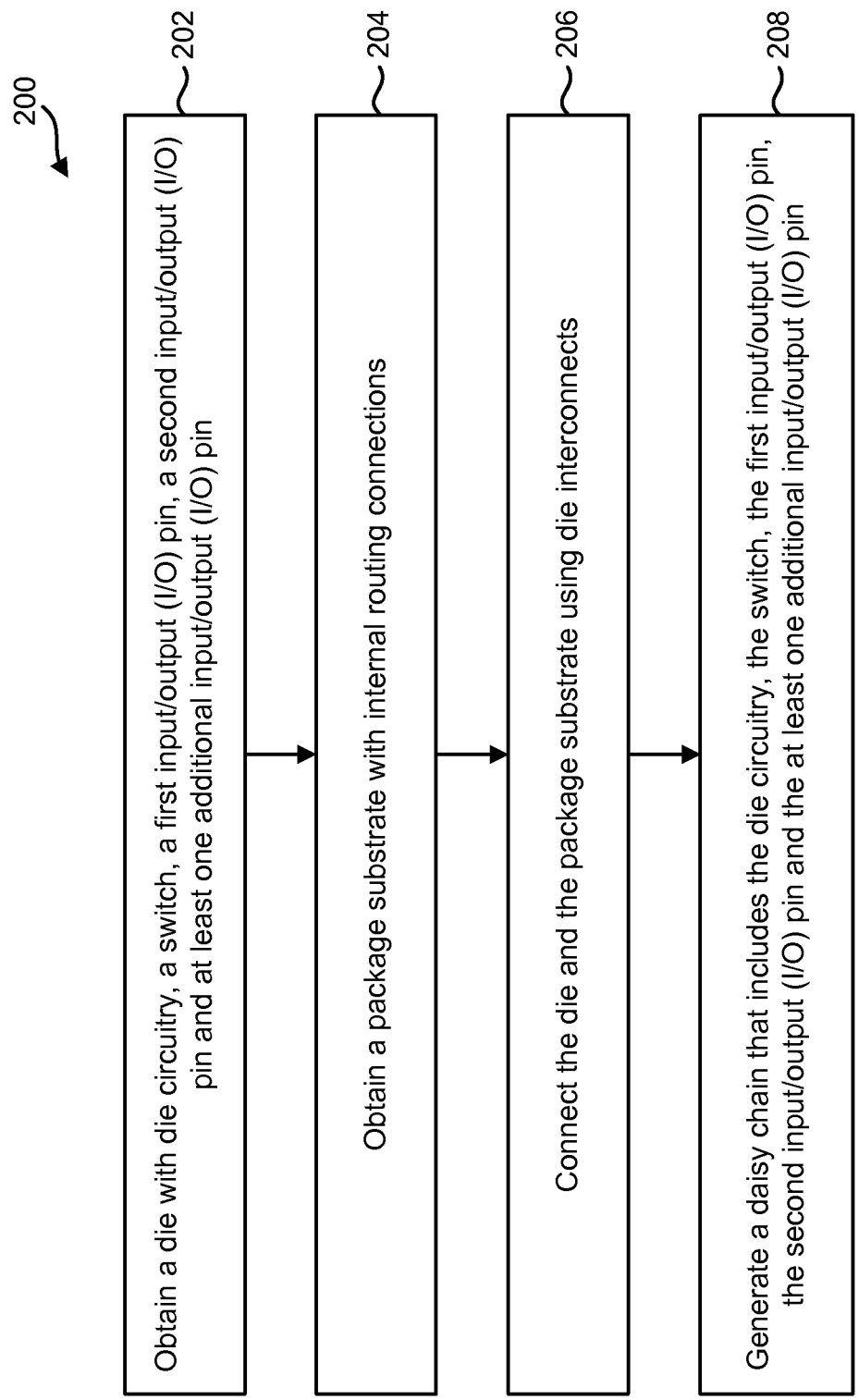
FIG. 2 is a flow diagram of a method for generating an integrated circuit product package for testing continuity of circuitry fabricated on a semiconductor die.

FIG. 2 is a flow diagram of a method 200 for generating an integrated circuit product package 102 for testing continuity of circuitry fabricated on a semiconductor die. The method 200 may be performed by an engineer, a technician or a computer. In one configuration, the method 200 may be performed by a fabrication machine.

A die 104 with die circuitry may be obtained 202. The circuitry on the die 104 may be part of an integrated circuit. The die 104 may include a switch 112, a first I/O pin 110, a second I/O pin 110 and at least one additional I/O pin 110. The first I/O pin 110 and the second I/O pin 110 may be coupled together by the switch 112. The first I/O pin 110 and second I/O pin 110 may be adjacent pins. The die 104 may also include additional I/O pins 110 on the die 104. Further, other configurations of I/O pins 110 and switches 112 may be used on the die 104. The switch 112 may include one or more transistors. In one configuration, the switch 112 containing a transistor may be controlled using a voltage control signal applied to a gate of the transistor. Using the voltage control, the switch 112 may be turned on or off to connect or disconnect the first I/O pin 110, second I/O pin 110 and at least one additional I/O pin 110.

A package substrate 106 may be obtained 204. The package substrate 106 may include internal routing connections 116. The internal routing connections 116 may run between a first surface of the package substrate 106 and a second surface of the package substrate 106. Each of the internal routing connections 116 may be coupled to different I/O pins 110 on the die 104. For example, a first internal routing connection 116 may be coupled to a first I/O pin 110 and a second internal routing connection 116 may be coupled to a second I/O pin 110. Internal routing connections 116 may also be used to couple one I/O pin 110 to another I/O pin 110.

The die 104 and package substrate 106 may be connected 206 using die interconnects 114. The die interconnects 114 may be physically connected to a surface of the die 104 or package substrate 106 and used for connecting the die 104 to a first surface of the package substrate 106. Each of the die interconnects 114 may correspond to a different I/O pin 110 on the die 104. The die interconnects 114 may provide an electrical connection between components on the die 104 with components on the package substrate 106. For example, each of the I/O pins 110 may be coupled to internal routing connections 116 on the package substrate 106 through the die interconnects 114. The die interconnects 114 may be made from a variety of materials, such as solder balls or solder pads. Alternatively the die interconnects 114 may be implemented using vias or other technologies for connecting and/or providing an electrical connection between the die 104 and the package substrate 106. For example, the package on package (PoP) system may be implemented using flip chip assembly, wire bond or through silicon via (TSV) technology.

The package substrate 106 may be connected to a loadboard 108. The loadboard 108 may include internal routing, loadboard contacts 122, test probes 120 and substrate interconnects 118. The test probes 120 may be connected to the loadboard 108 by loadboard contacts 122. The test probes 120 may be connected to a second surface of the package substrate 106 by substrate interconnects 118. Using the substrate interconnects 118, test probes 120 and loadboard contacts 122, the internal routing on the loadboard 108 may be coupled to the internal routing connections 116 on the package substrate 106.

A daisy chain may be generated 208 using the die 104 and the package substrate 106. The daisy chain may include the die circuitry, a switch 112, a first I/O pin 110, a second I/O pin 110 and at least one additional I/O pin 110. Each of the components of the daisy chain may be coupled together to form a continuous chain of components. The daisy chain may include additional components coupled together to form a test channel, including additional I/O pins 110, switches 112, die interconnects 114 and internal routing connections 116 in various configurations. Components on the loadboard 108 may also be implemented in a daisy chain for testing continuity of the die 104. For example, a daisy chain may include a test channel input 124, loadboard contacts 122, test probes 120, substrate interconnects 118, internal routing connections 116 on the package substrate 106, die interconnects 114, switches 112, I/O pins 110, die circuitry and a test channel output 126. Various configurations of daisy chains may be implemented for testing continuity of circuitry on the die 104. Some examples of daisy chain configurations that may be used are explained herein.

Figure 3:
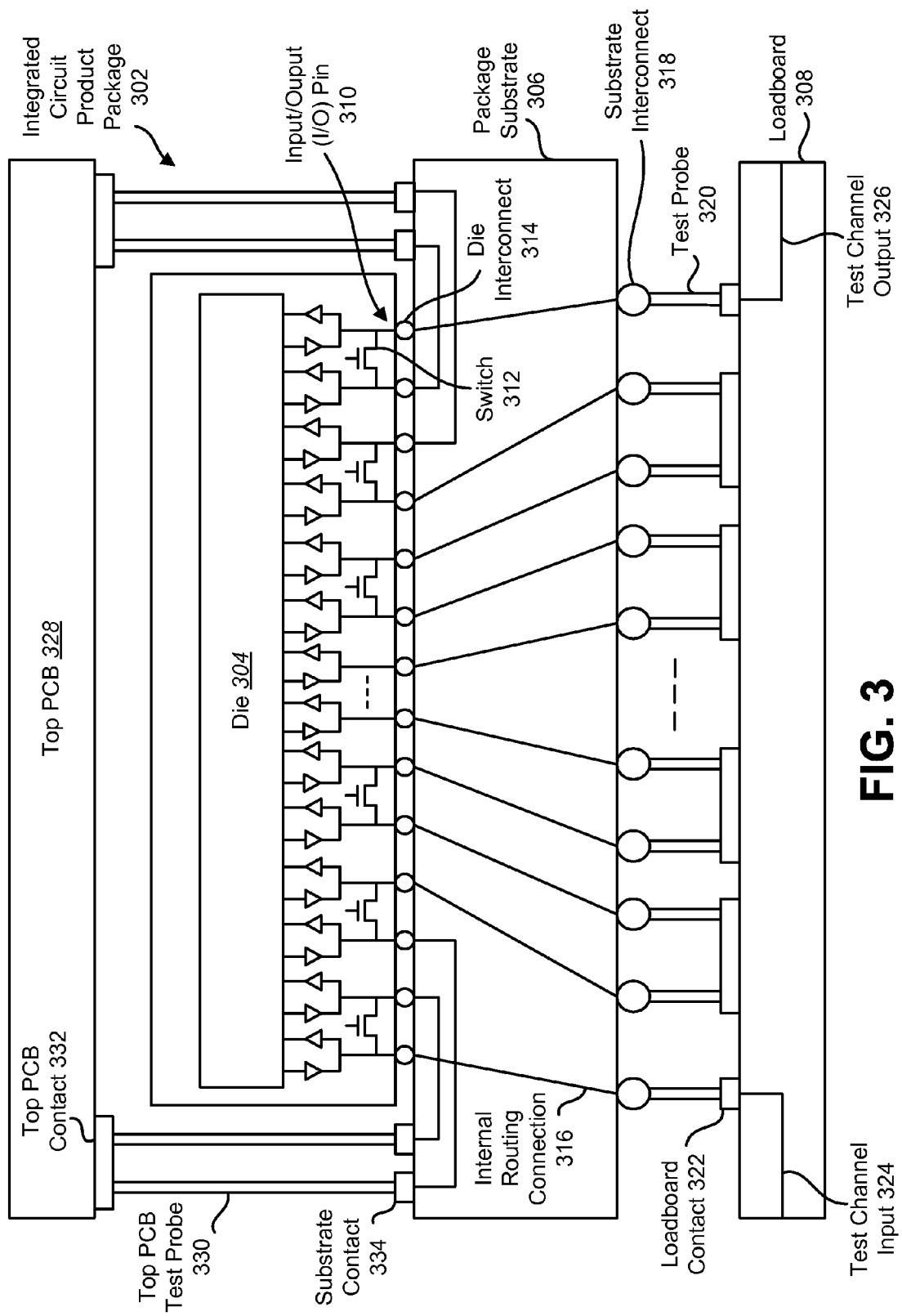
FIG. 3 illustrates one configuration of a package on package (PoP) system for testing continuity of circuitry fabricated on a semiconductor die.

FIG. 3 illustrates one configuration of a package on package (PoP) system for testing continuity of circuitry fabricated on a semiconductor die. The package on package (PoP) system may include an integrated circuit product package 302, which may include a die 304 and a package substrate 306. The integrated circuit product package 302 may be coupled to a loadboard 308 for testing continuity of the die circuitry that is fabricated on the die 304. The integrated circuit product package 302 may be one configuration of the integrated circuit product package 102 described above in connection with FIG. 1. The integrated circuit product package 302 may also be coupled to a top printed circuit board (PCB) 328 stacked vertically on top of the product package 302. Stacking the top PCB 328 on the integrated circuit product package 302 may provide additional connections to substrate contacts 334 during testing.

The integrated circuit product package 302 may include a die 304 and a package substrate 306. The die 304 may include I/O pins 310, switches 312 and other circuitry on the die 304. Circuitry on the die 304 may be implemented in an integrated circuit. The package substrate 306 may include internal routing connections 316. The die 304 and the package substrate 306 may be connected using die interconnects 314. The die 304, package substrate 306, I/O pins 310, switches 312, die interconnects 314 and internal routing connections 316 may be similar to corresponding elements 104, 106, 110, 112, 114 and 116 described above in connection with FIG. 1.

The integrated circuit product package 302 may also be connected to a loadboard 308. The loadboard 308 may include internal routing, including a test channel input 324 and a test channel output 326 used for testing continuity of a circuit. The loadboard 308 may include loadboard contacts 322 and sockets for housing test probes 320. The package substrate 306 of the integrated circuit product package 302 may connect to the loadboard 308 using substrate interconnects 318 and test probes 320. The loadboard 308, substrate interconnects 318, test probes 320 and loadboard contacts 322 may be similar to corresponding elements 108, 118, 120 and 122 described above in connection with FIG. 1.

The package on package (PoP) system may also include a top PCB 328. The top PCB 328 may include top PCB contacts 332 on a surface of the top PCB 328. The top PCB 328 may also include internal routing (not shown). The top PCB 328 may be made from a variety of materials.

The top PCB 328 may be coupled to the integrated circuit product package 302 via multiple top PCB test probes 330. Each of the top PCB test probes 330 may be housed within a test socket on the top PCB 328. A first end of each top PCB test probe 330 may be connected to a substrate contact 334 while a second end of each top PCB test probe 330 may be connected to a top PCB contact 332. In some configurations, the top PCB test probes 330 may include spring probes. Each spring probe may be housed within one of the test sockets on the top PCB 328. When the integrated circuit product package 302 is placed in contact with the spring probes, the spring probes may compress and form an electrical connection between the substrate contacts 334 and the top PCB contacts 332. In addition, the substrate contacts 334 may be made from a variety of materials, such as solder balls, pads or other types of interconnects.

The top PCB test probes 330 may be connected to the top PCB 328 via top PCB contacts 332. The top PCB test probes 330 may also be connected to the package substrate 306 via substrate contacts 334. The top PCB contacts 332 and substrate contacts 334 may be made from a variety of materials. In one configuration, the substrate contacts 334 and top PCB contacts 332 are made from solder balls or solder pads for connecting the top PCB 328 and/or the package substrate 306 to the top PCB test probes 330.

An I/O pin 310 on the die 304 may be coupled to a substrate contact 334 through an internal routing connection 316 on the package substrate 306. The substrate contact 334 may be coupled to a top PCB test probe 330. The top PCB test probe 330 may be coupled to a top PCB contact 332. Therefore, an I/O pin 310 may be coupled to routing or circuitry contained on the top PCB 328 through an internal routing connection 316, a substrate contact 334, a top PCB test probe 330 and a top PCB contact 332. Two or more top PCB test probes 330 may be coupled together by a single top PCB contact 332. While the configuration shown in FIG. 3 illustrates four top PCB test probes 330 in a package on package (PoP) system, more or fewer top PCB test probes 330 may be used in other configurations.

The package on package (PoP) system may be used to implement one or more daisy chains. A daisy chain may include components on the die 304, package substrate 306 and loadboard 308. Additionally, a daisy chain may include substrate contacts 334, top PCB test probes 330, top PCB contacts 332, internal routing on the top PCB 328 and other circuitry on the top PCB 328. Each of the components that make up the daisy chain may be coupled together to form a single electrical path of components. A test channel may be generated using a daisy chain by passing an electrical signal from a first end of the daisy chain to a second end of the daisy chain. Therefore, components on the die 304 and top PCB 328 included within a daisy chain may be tested for continuity using a single test channel.

In one configuration, a first end of a daisy chain may begin at a test channel input 324 coupled to a first loadboard contact 322. The daisy chain may continue sequentially through a first test probe 320, a first substrate interconnect 318, a first internal routing connection 316, a first die interconnect 314 and into the die 304 through a first I/O pin 310. The same daisy chain may continue through a switch 312 connecting the first I/O pin 310 and an adjacent I/O pin 310. Passing through the switch 312, the daisy chain may continue through the second I/O pin 310, a second die interconnect 314, a second internal routing connection 316 and through a first substrate contact 334 into a first top PCB test probe 330. The daisy chain may continue through a top PCB contact 332 coupling the first top PCB test probe 330 to a second top PCB test probe 330. The daisy chain may also continue through the second top PCB test probe 330, a third internal routing connection 316 and into a third I/O pin 310 on the die 304. The daisy chain may continue through additional components on the package on package (PoP) system, including additional die circuitry, switches 312, I/O pins 310, die interconnects 314, internal routing connections 316, substrate interconnects 318, test probes 320, etc. After passing through additional components on the integrated circuit product package 302, loadboard 308 and top PCB 328, a second end of the daisy chain may pass through a loadboard contact 322 into a test channel output 326 on the loadboard 308. An electrical signal applied to the test channel input 324 may be configured to pass through each component on the daisy chain and be output at the test channel output 326.

By configuring the switches 312, loadboard contacts 322, substrate contacts 334 and top PCB contacts 332 to couple each of the I/O pins 310 and one or more top PCB components together into a single electrical path, a daisy chain may be generated that extends through each of the I/O pins 310 on the die as well as components on the top PCB 328. In some configurations, each of the I/O pins 310 as well as components on the top PCB 328 may be included in one continuous daisy chain. A test channel may be formed using the daisy chain by connecting a first end of the daisy chain to a test channel input 324 and a second end of the daisy chain to a test channel output 326. The continuity of the circuitry on the daisy chain may be tested by applying an electrical signal to one end of the test channel and measuring a voltage or current of the test channel as a signal passes through the daisy chain. The continuity of each of the components on the daisy chain, including the die 304 and top PCB 328, may be determined through observation of the signal that passes through the test channel. Further, by implementing one or more daisy chains that pass through both the top PCB 328 and the integrated circuit product package 302 in a package on package (PoP) system, the continuity of an electrical path from the top PCB 328 to the die 304 and an electrical path from a substrate interconnect 318 to the die 304 may be tested at the same time, instead of using a two-step testing method where the continuities of these electrical paths are tested separately.

Moreover, similar to the system described above in connection with FIG. 1, multiple daisy chains may be used for testing continuity of circuitry on the package on package (PoP) system. For example, multiple daisy chains may be formed that tests circuitry on different portions of the circuitry on both the die 304 and the top PCB 328. By using multiple daisy chains, the location of any continuity fails on the package on package (PoP) system may be precisely detected.

By implementing a top PCB 328 in a package on package (PoP) system, additional components may be stacked vertically using less real estate on a loadboard 308 or a printed circuit board (PCB). Thus, stacking the top PCB 328 on the integrated circuit product package 302 may reduce the footprint of the integrated circuit product package 302 on the loadboard 308 as well as reduce the number of resources needed for testing continuity of a die 304. Further, by stacking the top PCB 328 on the integrated circuit product package 302, continuity of the top PCB 328 may be tested without connecting the top PCB 328 directly to the loadboard 308 via one or more return lines for testing continuity on the top PCB 328. Eliminating the return lines and larger or specialized test probes that would span from the top PCB 328 to the loadboard 308 may substantially reduce the footprint of the DUT on the loadboard 308. By reducing the footprint of DUTs on the loadboard 308, it may be possible to fit additional sites into a loadboard 308.

In one configuration, eight integrated circuit product packages 302 coupled to one or more top PCBs 328 may be tested using a single loadboard 308. While each of the integrated circuit product packages 302 may be independent from each other and tested one at a time, each of the packages may be efficiently tested by duplicating the connection of one or more test channels with each of the DUTs on the loadboard 308.

Figure 4:
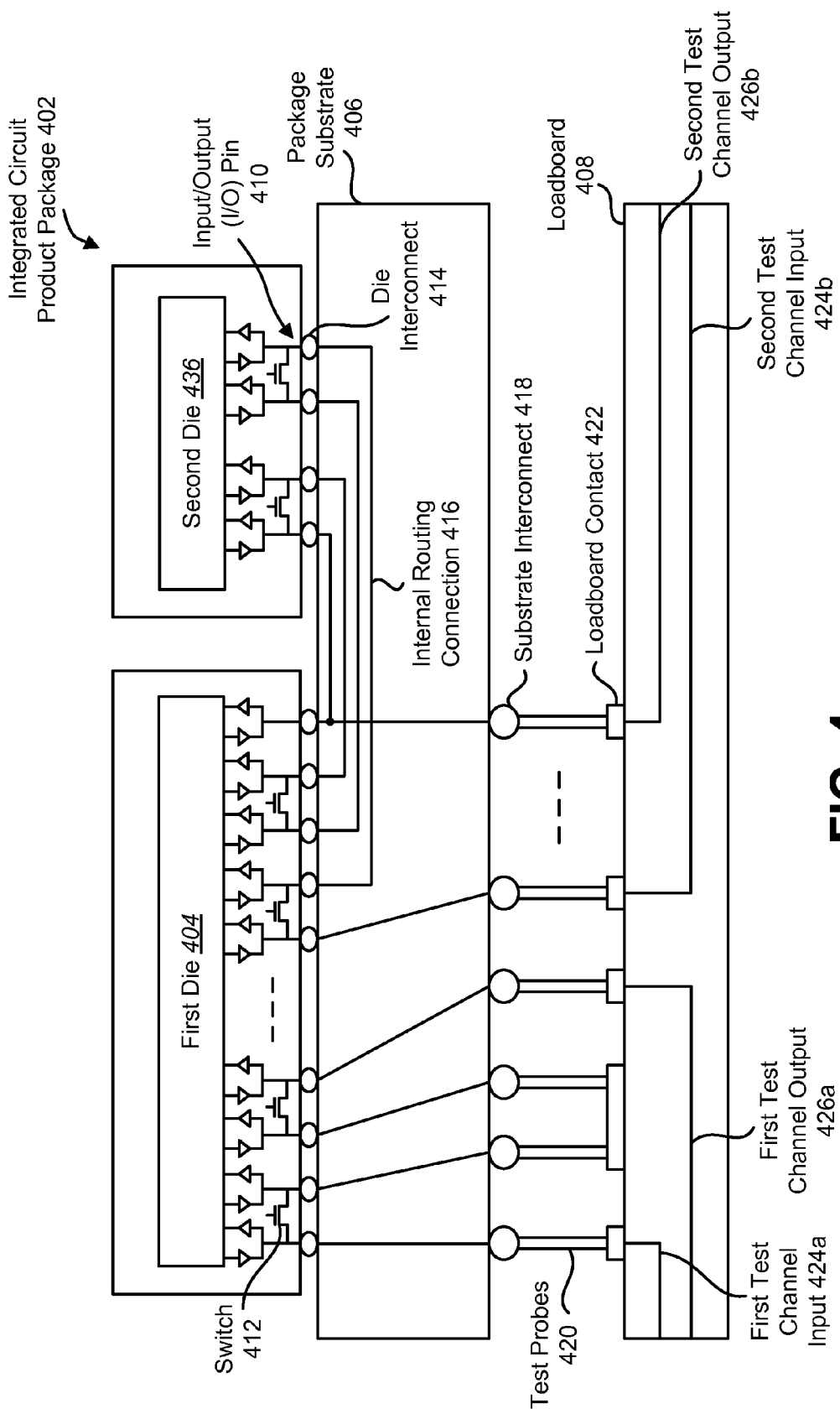
FIG. 4 illustrates one configuration of a system in package (SiP) system for testing continuity of circuitry fabricated on a first semiconductor die and a second semiconductor die.

FIG. 4 illustrates one configuration of a system in package (SiP) system for testing continuity of circuitry fabricated on a first semiconductor die and a second semiconductor die. The system in package (SiP) system may include an integrated circuit product package 402 including a first die 404 and a second die 436. The integrated circuit product package 402 may also include a package substrate 406 coupled to the first die 404 and the second die 436 via die interconnects 414. The integrated circuit product package 402 may be one configuration of the integrated product packages 102, 302 described above in connection with FIG. 1 and FIG. 3, including a first die 404 and a second die 436.

The integrated circuit product package 402 may include a first die 404, a second die 436 and a package substrate 406. The first die 404 may include I/O pins 410, switches 412 and other circuitry on the die 404. Circuitry on the first die 404 may be implemented in an integrated circuit. The package substrate 406 may include internal routing connections 416. The first die 404 and the package substrate 406 may be connected using die interconnects 414. The die 404, package substrate 406, I/O pins 410, switches 412, die interconnects 414 and internal routing connections 416 may be similar to corresponding elements 104, 106, 110, 112, 114 and 116 described above in connection with FIG. 1.

The integrated circuit product package 402, including the first die 404 and the second die 436, may also be connected to a loadboard 408. The loadboard 408 may include internal routing, including a test channel input 424 and a test channel output 426 used for testing continuity of a circuit. The loadboard 408 may include loadboard contacts 422 and sockets for housing test probes 420. The package substrate 406 of the integrated circuit product package 402 may connect to the loadboard 408 using substrate interconnects 418 and test probes 420. The loadboard 408, substrate interconnects 418, test probes 420 and loadboard contacts 422 may be similar to corresponding elements 108, 118, 120 and 122 described above in connection with FIG. 1.

The system in package (SiP) system may also include a second die 436. The second die 436 may include similar components as the first die 404, such as I/O pins 410, switches 412 and circuitry. In one configuration, the circuitry on the second die 436 may be implemented on an integrated circuit. In some configurations, additional dies may be implemented in an SiP system. Moreover, while the SiP may be implemented using flip chip assembly technology, the same approach may be used for wire bond or through silicon via (TSV) technology.

The second die 436 may be coupled to the package substrate 406 via multiple die interconnects 414. The die interconnects 414 may be used to attach the second die 436 to the package substrate 406. The die interconnects 414 may also be used to create an electrical connection from the I/O pins 410 on the second die 436 to internal routing connections 416 passing through the package substrate 406. Each of the I/O pins 410 on the second die 436 may correspond to a different die interconnect 414. The die interconnects 414 may be physically connected to a surface of the second die 436. Further, the die interconnects 414 may be made from a variety of materials, such as solder balls or solder pads for connecting the second die 436 and the package substrate 406. The die interconnects 414 may also be implemented using vias or other technologies for connecting and/or providing an electrical connection between the second die 436 and the package substrate 406.

The I/O pins 410 on the second die 436 may be coupled to one or more I/O pins 410 on the first die 404 internally to the integrated circuit product package 402 using the internal routing channels 416 on the package substrate 406. By connecting each of the I/O pins 410 on the second die 436 to different I/O pins 410 on the first die 404, each of the I/O pins 410 on the second die 436 may be coupled to internal routing 416 on the loadboard 408 via connections to the loadboard 408 from the first die 404. Therefore, using the connections to the loadboard 408 from the first die 404, the second die 436 may be electrically coupled to the loadboard 408 using the internal routing connections 416 of the package substrate 406.

The SiP system may be used to implement one or more daisy chains. A daisy chain may include components on the first die 404, package substrate 406 and loadboard 408. Additionally, a daisy chain may also include components on the second die 436 and internal routing connections 416 on the package substrate 406 connecting the first die 404 and the second die 436. Each of the components that make up the daisy chain may be coupled together to form a single electrical path of components. A test channel may be generated using a daisy chain by passing an electrical signal from a first end of the daisy chain to a second end of the daisy chain. Therefore, components on the first die 404 and second die 436 included within a daisy chain may be tested for continuity using a single test channel.

The SiP system of FIG. 4 illustrates two possible daisy chains that may be implemented for testing continuity of circuitry within the SiP system. A first daisy chain may begin at a first test channel input 424*a* coupled to a first loadboard contact 422. The daisy chain may continue sequentially through a first test probe 420, a first substrate interconnect 418, a first internal routing connection 416, a first die interconnect 414 and into the first die 404 through a first I/O pin 410. The same daisy chain may continue through a switch 412 connecting the first I/O pin 410 and an adjacent second I/O pin 410. Passing through the switch 412, the daisy chain may continue through the second I/O pin 410, a second die interconnect 414, a second internal routing connection 416, a second substrate interconnect 418, a second test probe 420 and a second loadboard contact 422 coupling the second test probe 420 to a third test probe 420. The daisy chain may continue through additional components on the integrated circuit product package 402. In one configuration, the first daisy chain passes through I/O pins 410 on the first die 404 without passing through any of the components on the second die 436. A second end of the daisy chain may pass through a loadboard contact 422 into a first test channel output 426*a* on the loadboard 408. An electrical signal applied to the first test channel input 424*a* may be configured to pass through each component on the daisy chain and be output at the first test channel output 426*a*.

The SiP system may also implement a second daisy chain. In contrast to the first daisy chain, the second daisy chain passes through components on multiple dies 404, 436. In one configuration a first end of the second daisy chain may begin at a second test channel input 424*b* coupled to a first loadboard contact 422. The daisy chain may continue sequentially through a first test probe 420, a first substrate interconnect 418, a first internal routing connection 416, a first die interconnect 414 and into the first die 404 through a first I/O pin 410 on the first die 404. The same daisy chain may extend through a switch 412 on the first die coupling the first I/O pin 410 to an adjacent I/O pin 410 on the first die 404. Passing through the switch 412, the daisy chain may continue through the second I/O pin 410 on the first die 404, a second die interconnect 414, a second internal routing connection 416, a first die interconnect 414 on the second die 436 and into the second die 436 through a first I/O pin 410 on the second die 436. The daisy chain may extend through a switch 412 on the second die 436 coupling the first I/O pin 410 on the second die 436 with a second I/O pin 410 on the second die 436. Passing through the switch 412, the daisy chain may continue to pass back and forth between I/O pins 410 on the first die 404 and the second die 436. The daisy chain may continue through additional components on the integrated circuit product package 402, including components on the first die 404 and the second die 436. A second end of the second daisy chain may pass through a loadboard contact 422 into a second test channel output 426*b* on the loadboard 408. An electrical signal applied to the second test channel input 424*b* may be configured to pass through each component on the daisy chain, including the first die 404 and the second die 436, and be output at the second test channel output 426*b*.

By configuring the switches 412, internal routing connections 416 and loadboard contacts 422 to couple I/O pins 410 on the first die 404 and the second die 436 together into a single electrical path, a daisy chain may be generated that extends through I/O pins 410 on both the first die 404 and the second die 436. In some configurations, multiple I/O pins 410 on the first die 404 and multiple I/O pins 410 on the second die 436 may be included in a single daisy chain. A test channel may be formed using a daisy chain by connecting a first end of the daisy chain to a test channel input 424 and a second end of the daisy chain to test channel output 426. The continuity of the circuitry on the first die 404 and the second die 436 may be tested by applying an electrical signal to one end of the test channel and measuring a voltage or current of the test channel as a signal passes through the daisy chain. The continuity of each of the components on the daisy chain, including the first die 404 and second die 436, may be determined through observation of the signal that passes through the test channel.

By implementing one or more daisy chains that pass through both the first die 404 and the second die 436 in an SiP system, the continuity of a second die 436 coupled to a first die 404 using internal routing connections 416 may be tested without performing separate functional or structural tests on the second die 436. Testing the second die 436 at the same time as the first die 404 using a single daisy chain may save space and time when testing the continuity of one or more dies in an SiP system.

Figure 5:
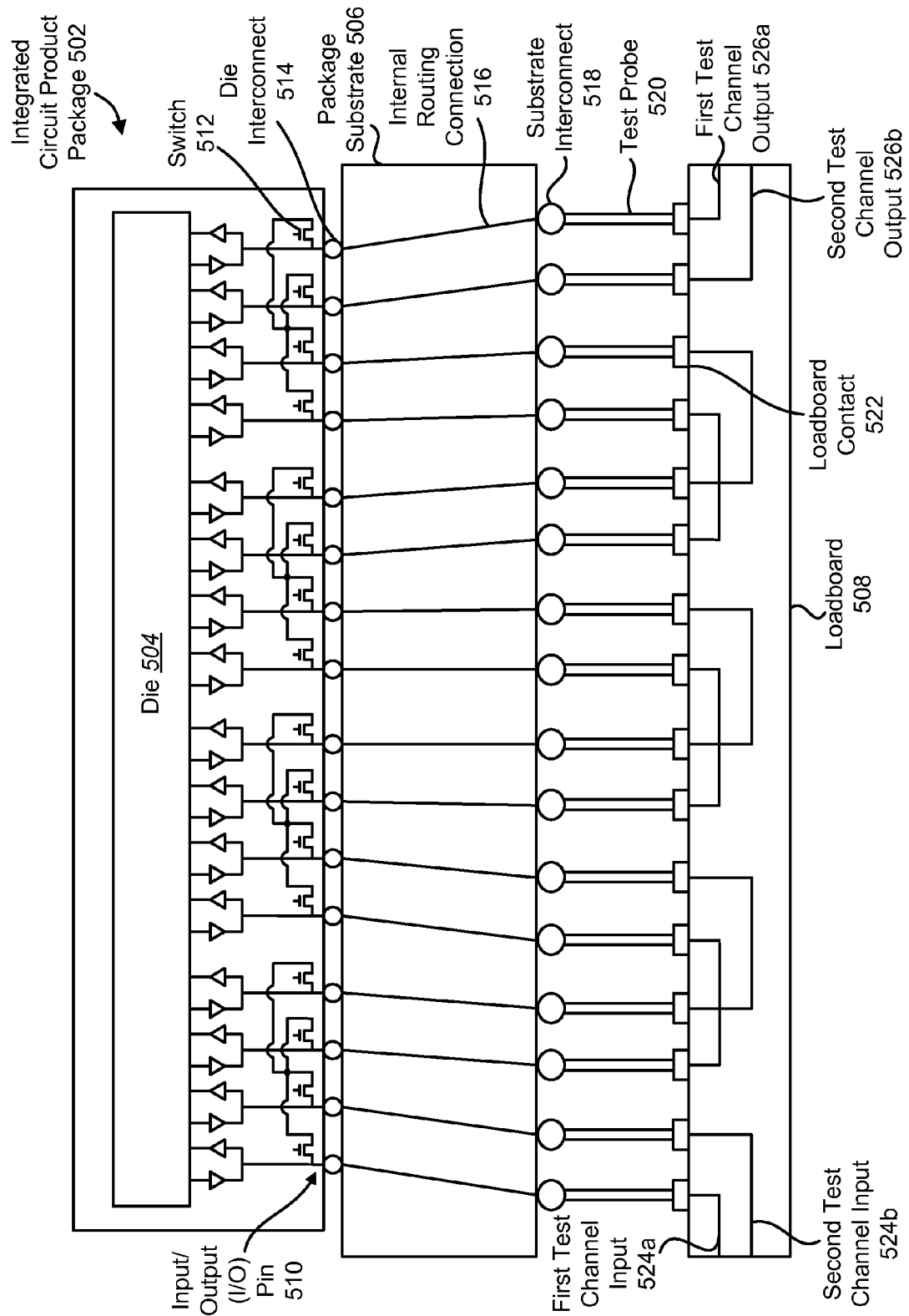
FIG. 5 illustrates another configuration of a system for testing continuity of circuitry fabricated on a semiconductor die.

FIG. 5 illustrates another configuration of a system for testing continuity of circuitry fabricated on a semiconductor die. The system includes an integrated circuit product package 502, which may include a die 504 and a package substrate 506. The integrated circuit product package 502 may be coupled to a loadboard 508 for testing continuity of the die circuitry that is fabricated on the die 504. The integrated circuit product package 502 may be one configuration of the integrated circuit product package 102 described above in connection with FIG. 1.

The integrated circuit product package 502 may include a die 504 and a package substrate 506. The die 504 may include I/O pins 510, switches 512 and other circuitry on the die 504. Circuitry on the die 504 may be implemented in an integrated circuit. The package substrate 506 may include internal routing connections 516. The die 504 and the package substrate 506 may be connected using die interconnects 514. The die 504, package substrate 506, I/O pins 510, switches 512, die interconnects 514 and internal routing connections 516 may be similar to corresponding elements 104, 106, 110 112, 114 and 116 described above in connection with FIG. 1.

The integrated circuit product package 502 may also be connected to a loadboard 508. The loadboard 508 may include internal routing 516, including test channel inputs 524 and test channel outputs 526 used for testing continuity of a circuit. The loadboard 508 may include loadboard contacts 522 and sockets for housing test probes 520. The package substrate 506 of the integrated circuit product package 502 may connect to the loadboard 508 using substrate interconnects 518 and test probes 520. The loadboard 508, substrate interconnects 518, test probes 520 and loadboard contacts 522 may be similar to corresponding elements 108, 118, 120 and 122 described above in connection with FIG. 1.

A die 504 may include groups of I/O pins 510 shorted together using one or more switches 512. The switches 512 may be analog switches including one or more transistors. A die 504 may include groups of four I/O pins 510 shorted together using one or more transistors on the die 504. Other configurations may include additional I/O pins 510 (e.g., 8, 16, 32 pins) grouped together by a configurations of switches 512. The switches 512 may be configured to short or disconnect different I/O pins 510 within the same group of I/O pins 510. In one example, the switches 512 may be used to connect non-adjacent I/O pins 510 together. Further, the I/O pins 510 within a particular group may not include any switches 512 connecting one or more I/O pins 510 from that group to any other group on the die 504. Therefore, the different groups of I/O pins 510 may not be electrically connected within the die 504 to other groups of I/O pins 510.

The loadboard 508 may also include internal routings for coupling one or more loadboard contacts 522 to other loadboard contacts 522. In one configuration, internal routing on the loadboard 508 may be used to couple non-adjacent loadboard contacts 522 together. Therefore, instead of using a loadboard contact 522 for coupling one or more test probes 520 together, internal routing on the loadboard 508 may be used to couple one or more test probes 520 together, without sharing a loadboard contact 522. The loadboard contacts 522 coupled together by the internal routing on the loadboard 508 may be non-adjacent loadboard contacts 522. Coupling different loadboard contacts 522 together may be used to couple one group of I/O pins 510 to another group of I/O pins 510.

The integrated circuit product package 502 may implement daisy chains using the groupings of I/O pins 510 on the die. In one configuration, the switches 512 on the die 504 may be configured to generate a daisy chain that passes through multiple I/O pins 510 to form a single electrical path of components on the die 504. A test channel may be generated using the daisy chain by passing an electrical signal from a first end of the daisy chain to a second end of the daisy chain. Therefore, using one or more daisy chains, the DUT may be efficiently tested for continuity using fewer test channels.

The system illustrated in FIG. 5 illustrates two possible configurations of daisy chains that may be used when testing continuity of circuitry on a die 504. A first daisy chain may begin at a first test channel input 524a coupled to a first loadboard contact 522. The daisy chain may continue sequentially through a first test probe 520, a first substrate interconnect 518, a first internal routing connection 516, a first die interconnect 514 and into the die 504 through a first I/O pin 510. The first I/O pin 510 may be a part of a group of four I/O pins 510. The same daisy chain may continue through a switch 512 connecting the first I/O pin 510 and a third I/O pin 510. The first I/O pin 510 and the third I/O pin 510 may be non-adjacent I/O pins 510. Passing through the switch 512 connecting the first I/O pin 510 and the third I/O pin 510, the daisy chain may continue through the third I/O pin 510 and through a corresponding die interconnect 514, internal routing connection 516, substrate interconnect 518, test probe 520 and loadboard contact 522 coupled to the test probe 520. The test probe 520 may be coupled to a non-adjacent loadboard contact 522 via internal routing on the loadboard 508. The daisy chain may continue to pass through alternating non-adjacent loadboard contacts 522 and alternating non-adjacent I/O pins 510 on the die. After passing through alternating I/O pins 510, a second end of the daisy chain may pass through a loadboard contact 522 into a first test channel output 526a on the loadboard 508. An electrical signal applied to the first test channel input 524a may be configured to pass through each component on the daisy chain and be output at the first test channel output 526a.

In addition to the first daisy chain described above, the same configuration of the integrated circuit product package 502 may also implement a second daisy chain for testing continuity of circuitry on the die 504. A first end of the second daisy chain may begin at a second test channel input 524b coupled to a second loadboard contact 522. The daisy chain may continue sequentially through a second test probe 520, a second substrate interconnect 518, a second internal routing connection 516, a second die interconnect 514 and into the die 504 through a second I/O pin 510. The second I/O pin 510 may be a part of a group of four I/O pins 510. The same daisy chain may continue through a switch 512 connecting the second I/O pin 510 and a fourth I/O pin 510. The second I/O pin 510 and the fourth I/O pin 510 may be non-adjacent I/O pins 510. Passing through the switch 512 connecting the second I/O pin 510 and the fourth I/O pin 510, the daisy chain may continue through the fourth I/O pin 510 and through a corresponding die interconnect 514, internal routing connection 516, substrate interconnect 518, test probe 520 and loadboard contact 522 coupled to the test probe 520. The test probe 520 may be coupled to a non-adjacent loadboard contact 522 via internal routing on the loadboard 508. The daisy chain may continue to pass through alternating non-adjacent loadboard contacts 522 and alternating other non-adjacent I/O pin 510 on the die. After passing through alternating I/O pins 510, a second end of the second daisy chain may pass through a loadboard contact 522 into a second test channel output 526b on the loadboard 508. An electrical signal applied to the second test channel input 524b may be configured to pass through each component on the daisy chain and be output at the second test channel output 526b.

By configuring the switches 512 connecting I/O pins 510 together into a single electrical path, a daisy chain may be generated that extends through multiple I/O pins 510 on the die 504. In some configurations, the integrated circuit product package 502 may implement two daisy chains that pass through alternating I/O pins 510 across the entire die 504. A test channel may be formed using a daisy chain by connecting a first end of the daisy chain to a test channel input 524 and a second end of the daisy chain to a test channel output 526. The continuity of circuitry associated with the I/O pins 510 on the daisy chain may be tested by applying an electrical signal to one end of the test channel and measuring a voltage or current of the test channel as a signal passes through the daisy chain. The continuity of each of the components on the daisy chain may be determined through observation of the signal that passes through the test channel.

The switches 512 on the die may be used specifically to connect non-adjacent I/O pins 510 on the die 504. By connecting non-adjacent I/O pins 510, it is possible to detect unwanted shorts between adjacent I/O pins 510. Specifically, if adjacent I/O pins 510 are coupled together in a daisy chain, it may not be possible to determine if the connection between adjacent I/O pins 510 is through a switch 512 or an unwanted short. Thus, connecting non-adjacent I/O pins 510 using daisy chains may enable testing continuity between adjacent I/O pins 510. Therefore, in an example configuration with groups of multiple (e.g., four) I/O pins 510, it may be possible to check the continuity of each I/O pin 510 using only two daisy chains connecting alternating and non-adjacent I/O pins 510 on the die 504. In other configurations, different numbers of I/O pins 510 (e.g., 8, 16, 32 pins) may be grouped together in various configurations of daisy chains. Further, any number of I/O pins 510 may be grouped together in various daisy chain configurations.

Multiple daisy chains may be implementing on the integrated circuit product package 502 depending on the number and configuration of groups of I/O pins 510 on the die 504. For example, the integrated circuit product package 502 may include groups of four I/O pins 510. Alternatively, the integrated circuit product package 502 may include groups of eight, sixteen or thirty-two I/O pins 510 grouped together. Further, the number of daisy chains used for testing continuity may be as few as one or as many as sixteen daisy chains for testing a die containing thirty-two I/O pins 510. Therefore, depending on availability of space on a loadboard 508 or demands of a particular system, switches 512 on the die 504 may be configured to increase or decrease the number of daisy chains implemented on the integrated circuit product package 502.

Figure 6:
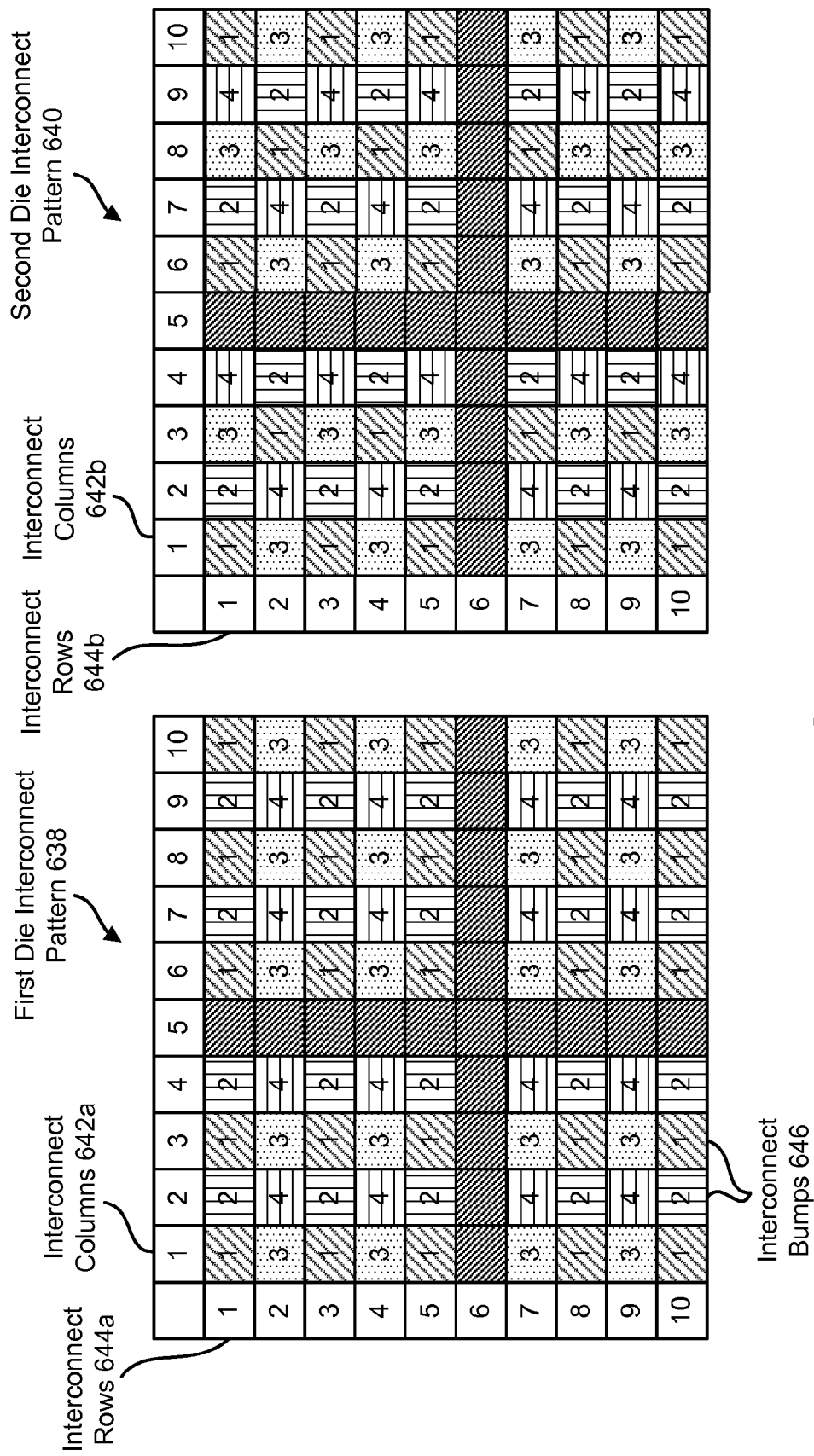
FIG. 6 is a top view of patterns of die interconnects that may be used in a system for testing continuity of circuitry fabricated on a semiconductor die.

FIG. 6 is a top view of patterns of die interconnects that may be used in a system for testing continuity of circuitry fabricated on a semiconductor die. Specifically, FIG. 6 illustrates a first die interconnect pattern 638 and a second die interconnect pattern 640. Each die interconnect 114 may be associated with a different I/O pin 110 on the die 104. As used herein, die interconnects 114 may also be referred to as solder balls, pads or interconnect bumps associated with corresponding I/O pins 110. Alternatively, the die interconnects 114 may be implemented using vias or other technologies for connecting and/or providing an electrical connection between I/O pins 110 on a die 104 and a package substrate 106. Further, each row or column of the die interconnect patterns 638, 640 may be one configuration used in the integrated product packages 102, 302, 402 and 502 described above in connection with FIG. 1, FIG. 3, FIG. 4 and FIG. 5.

A first die interconnect pattern 638 and a second die interconnect pattern 640 are shown. The first die interconnect pattern 638 illustrates one configuration of interconnect bumps 646 that may be implemented on an integrated circuit product package 102. The second die interconnect pattern 640 illustrates another configuration of die interconnects that may be implemented on an integrated circuit product package. Each interconnect bump 646 may be associated with a different I/O pin 110. Each of the first die interconnect pattern 638 and the second die interconnect pattern 640 includes ten interconnect rows 644a-b and ten interconnect columns 642a-b. Other patterns may be used with fewer or additional rows and columns of interconnect bumps 646.

The interconnect bumps 646 on the first die interconnect pattern 638 and the second die interconnect pattern 640 may be organized in four groups. Each group may correspond to a different daisy chain. In some configurations, none of the interconnect bumps 646 associated with a specific daisy chain group are adjacent to other interconnect bumps 646 associated with the same daisy chain group. Therefore, the daisy chains may be configured to include only non-adjacent interconnect bumps 646 associated with non-adjacent I/O pins 110 on a die 104.

In one configuration, a first die interconnect pattern 638 may include ten interconnect columns 642a and ten interconnect rows 644a. Each column and row may correspond to a row or column of interconnect bumps 646 associated with a row or column of I/O pins 110. Each row or column of interconnect bumps 646 of the first die interconnect pattern 638 may be similar to the configuration of die interconnects 114 and I/O pins 110 described above in connection with FIG. 5, with alternating interconnects bumps 646 on each row and column being associated with a different daisy chain. For example, alternating interconnect bumps 646 on the first row may be connected using a first daisy chain and a second daisy chain. Alternating interconnect bumps 646 on the second row may be connected using a third daisy chain and a fourth daisy chain. The third row may repeat the same pattern as the first row and so forth across the first die interconnect pattern 638, with alternating rows using different pairs of daisy chains. In some configurations, a row may not be connected to one or more daisy chains. As an example, the fifth column and sixth row of interconnect bumps 646 are not connected to one of the four daisy chains, and have no signal passing through the interconnect bumps 646 associated the fifth column or sixth row in the first die interconnect pattern 638.

A second die interconnect pattern 640 may include ten interconnect columns 642b and ten interconnect rows 644b. Each column and row may correspond to a column or row of interconnect bumps 646 associated with a row or column of I/O pins 110. Each column of interconnect bumps 646 on the second die interconnect pattern 640 may be similar to the configuration of die interconnects 514 and I/O pins 510 described above in connection with FIG. 5, with alternating interconnect bumps 646 on each column being associated with a different daisy chain. In one example, each interconnect row 644 includes interconnect bumps 646 associated with each of four daisy chains. The first, second, third and fourth daisy chains may be associated with a first row of interconnect bumps 646 on the first, second, third and fourth column of interconnect bumps 646. The second row of interconnect bumps 646 may include the same four daisy chains offset by two interconnect bumps 646 in either direction. In other words, on the second row of interconnect bumps 646, the first daisy chain may pass through an interconnect bump 646 on the third column, the second daisy chain may pass through an interconnect bump 646 on the fourth column, the third daisy chain may pass through an interconnect bump 646 on the first column and the fourth daisy chain may pass through an interconnect bump 646 on the second column. Therefore, the interconnect bumps 646 associated with each daisy chain may be offset by two columns for each subsequent row of interconnect bumps 646. Similar to the first die interconnect pattern 638, the fifth column and sixth row are shown as not being connected to one of the four daisy chains, and have no signal passing through the interconnect bumps 646 associated with the fifth column or sixth row in the second die interconnect pattern 640.

Each of the first die interconnect pattern 638 and the second die interconnect pattern 640 implement a pattern of interconnect bumps 646 that avoids adjacent I/O pins 110 being grouped together in the same daisy chain. By using four daisy chains through the die interconnect patterns 638, 640, none of the horizontal, vertical or diagonal interconnect bumps 646 share an adjacent connection with a common daisy chain. By configuring the daisy chains to avoid passing through adjacent I/O pins 110, shorts between I/O pins 110 may be more easily detected. Because adjacent I/O pins 110 that share a common daisy chain may not show any potential difference when a signal passes through the common daisy chain, it may be beneficial to use different daisy chains for adjacent I/O pins 110 to avoid undetectable shorts between adjacent I/O pins 110 on the same daisy chain.

More or less than four daisy chains may be used in other configurations. Additional daisy chains may be used specifically to more precisely determine the location of fails in continuity of circuitry on a die 104. Further, additional daisy chains and different pattern configurations may be used to pair non-adjacent I/O pins 110 together in daisy chains running through the integrated circuit product package 102.

Figure 7:
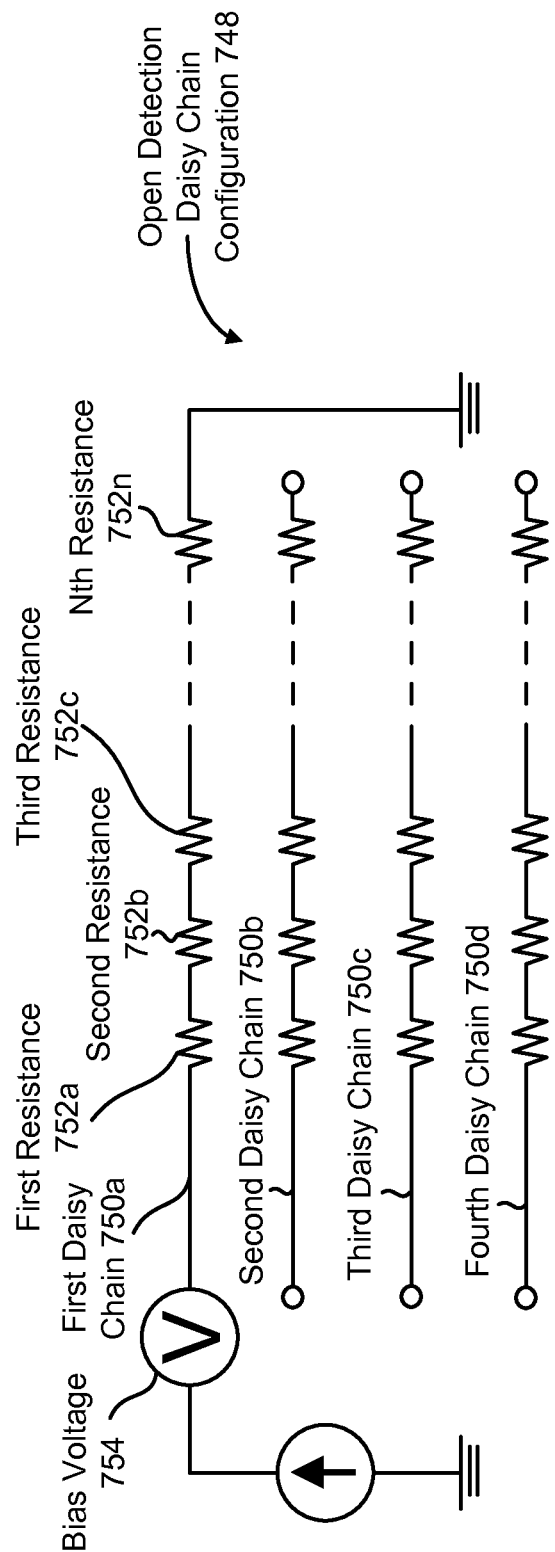
FIG. 7 illustrates a circuit diagram representing a configuration of daisy chains for detecting open circuits on a semiconductor die.

FIG. 7 illustrates a circuit diagram representing a configuration of daisy chains for detecting open circuits on a semiconductor die. The circuit diagram illustrates one configuration of an open detection daisy chain configuration 748. The open detection daisy chain configuration 748 may be modeled as a circuit with multiple resistances 752 representing circuits of multiple daisy chains 750 coupled together to form larger daisy chain circuits. The continuity of each daisy chain 750 may be tested by detecting open connections on each daisy chain 750.

The open detection daisy chain configuration 748 may be used for detecting open connections on multiple daisy chains 750. In one example, the open detection daisy chain configuration 748 may include four daisy chains 750a-d passing through various components on an integrated circuit product package 102 and a loadboard 108 similar to other configurations described herein. Each of the daisy chains 750 may include a first resistance 752a, second resistance 752b, a third resistance 752c and one or more additional resistances up to an Nth resistance 752n. Each resistance 752 on a daisy chain 750 may be used to represent circuitry (e.g., I/O pins 110, die circuitry) within a daisy chain 750. To test for open connections on the daisy chains 750, each end of a first daisy chain 750a may be coupled to a ground reference. Each end of a second daisy chain 750b, third daisy chain 750c and fourth daisy chain 750d may be coupled to open connections. A bias voltage 754 and/or current may be applied to a first end of the first daisy chain 750a and a resistance 752 of the first daisy chain 750a may be measured. Therefore, only one daisy chain 750 is connected to a complete circuit (e.g., a test channel) at a time when testing for open connections on the daisy chains 750. If a measurement on the first daisy chain 750a reads a certain finite resistance, the tests indicate that there are not any open connections on the first daisy chain 750a. If a measurement on the first daisy chain 750a reads an infinitely high resistance, an open circuit exists somewhere along the first daisy chain 750a. The test may then be repeated for each daisy chain 750 by disconnecting the first daisy chain 750a and repeating the test for each subsequent daisy chain 750b-d in the open detection daisy chain configuration 748.

Figure 8:
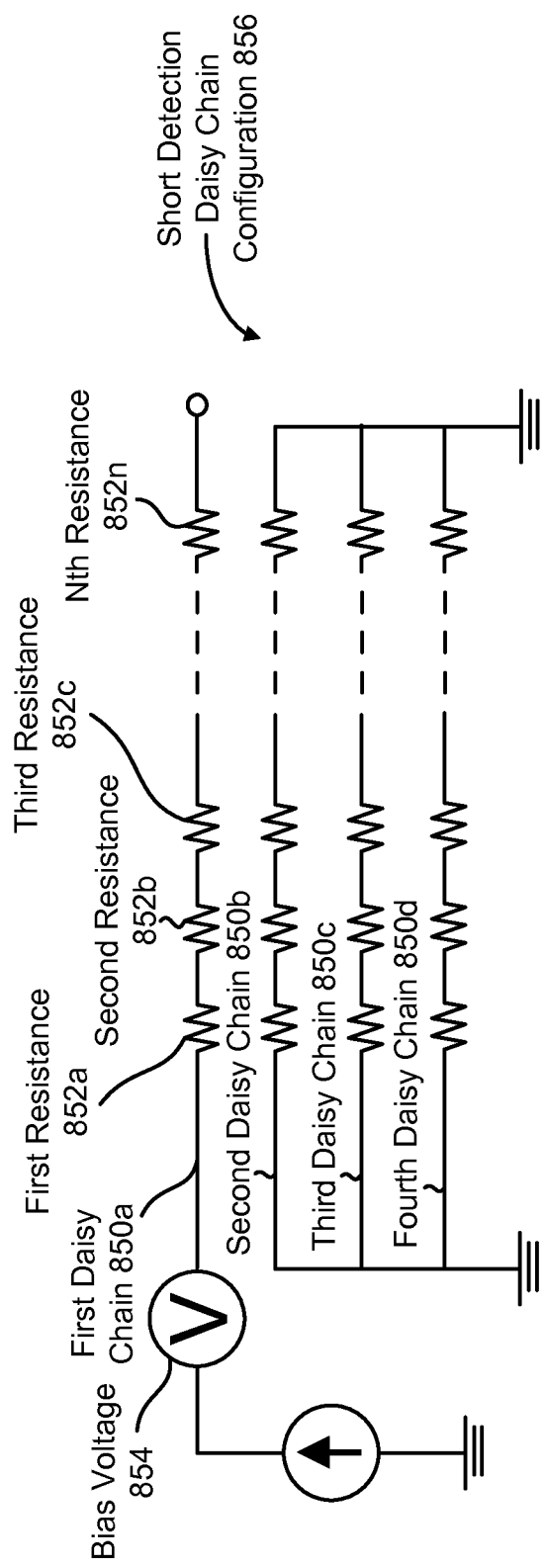
FIG. 8 illustrates a circuit diagram representing a configuration of daisy chains for detecting shorts on a semiconductor die.

FIG. 8 illustrates a circuit diagram representing a configuration of daisy chains for detecting shorts on a semiconductor die. The circuit diagram illustrates one configuration of a short detection daisy chain configuration 856. The short detection daisy chain configuration 856 may be modeled as a circuit with multiple resistances 852 representing circuits of multiple daisy chains 850 coupled together to form larger daisy chain circuits. The continuity of each daisy chain 850 may be tested by detecting shorts on each daisy chain 850.

The short detection daisy chain configuration 856 may be used for detecting shorts on multiple daisy chains 850. In one example, the short detection daisy chain configuration 856 may include four daisy chains 850a-d passing through various components on an integrated circuit product package 102 and a loadboard 108 similar to other configurations described herein. Each of the daisy chains 850 may include a first resistance 852a, second resistance 852b, a third resistance 852c and one or more additional resistances up to an Nth resistance 852n. Each resistance on the daisy chain may be used to represent circuitry (e.g., I/O pins 110, die circuitry) within a daisy chain 850. To test for shorts on the daisy chains 850, a first end of the first daisy chain 850a may be coupled to a ground reference while a second end of the first daisy chain 850a is coupled to an open connection. Each end of a second daisy chain 850b, third daisy chain 850c and fourth daisy chain 850d may be connected to a ground reference. A bias voltage 854 and/or current may be applied to a first end of the first daisy chain 850a and a resistance of the first daisy chain 850a may be measured. If a measurement on the first daisy chain 850a reads an infinitely high resistance, the tests indicate that there are not any shorts on the first daisy chain 850a. If the measurement on the first daisy chain 850a reads a certain finite resistance, a short exists somewhere between the daisy chains 850. The test may then be repeated for each daisy chain 850 by disconnecting the first daisy chain 850a and repeating the test for each of the subsequent daisy chains 850b-d in the short detection daisy chain configuration 856.

Figure 9:
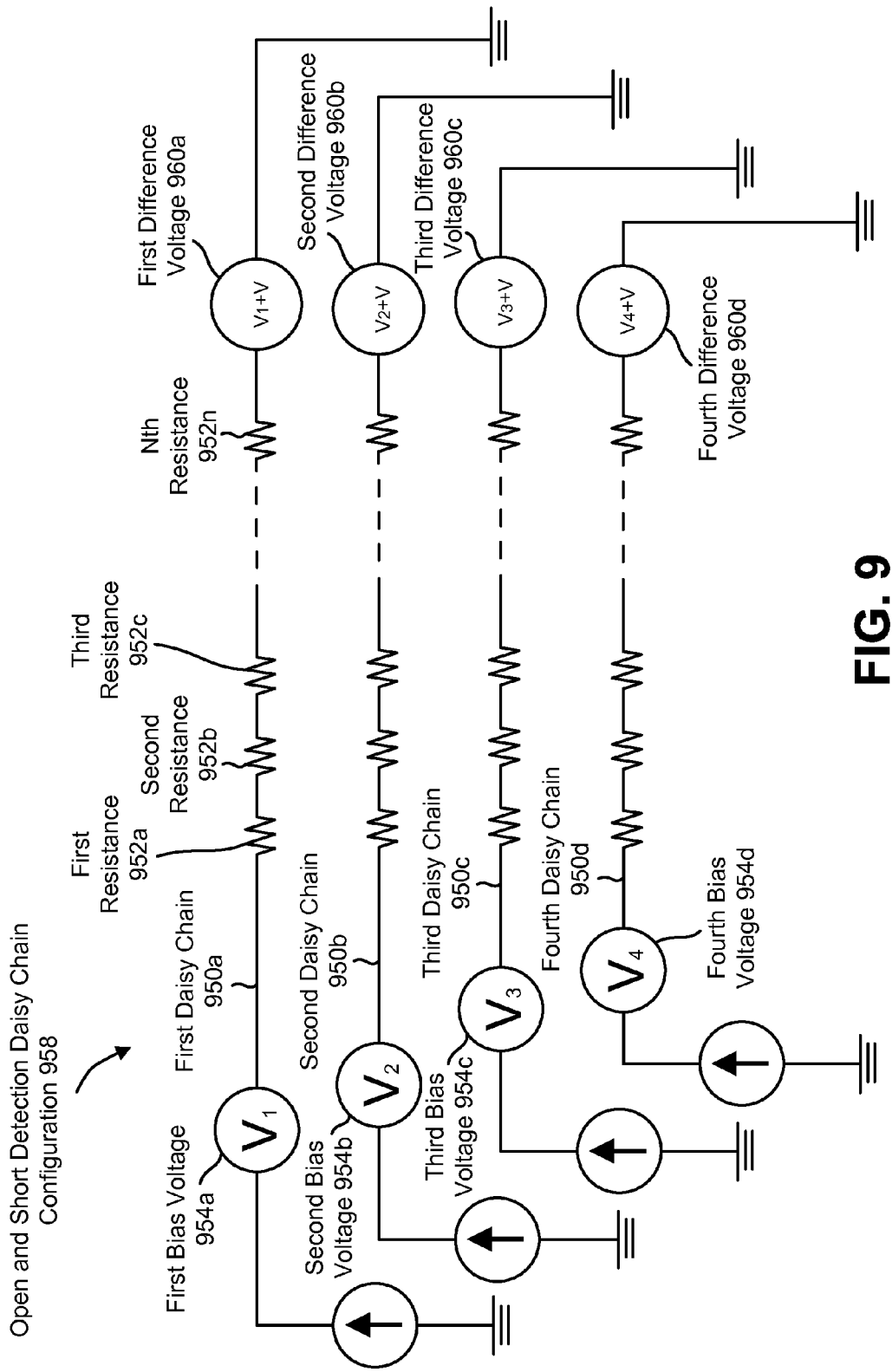
FIG. 9 illustrates a circuit diagram representing a configuration of daisy chains for detecting shorts and open circuits on a semiconductor die.

FIG. 9 illustrates a circuit diagram representing a configuration of daisy chains for detecting shorts and open circuits on a semiconductor die. The circuit diagram includes an open and short detection daisy chain configuration 958. The open and short detection daisy chain configuration 958 illustrates four daisy chains 950 modeled as a circuit with multiple resistances 952 representing circuits on each of the daisy chains 950. The open and short detection daisy chain configuration 958 may be used to detect open connections and shorts for each of the daisy chains 950 simultaneously.

The open and short detection daisy chain configuration 958 may include four daisy chains 950*a-d* passing through various components on an integrated circuit product package 102 and a loadboard 108 similar to other configurations described herein. Each of the daisy chains 950 may include a first resistance 952*a*, a second resistance 952*b*, a third resistance 952*c* and one or more additional resistances up to an Nth resistance 952*n*. Each resistance 952 on the daisy chains 950 may be used to represent circuitry (e.g., I/O pins 110, die circuitry) within a daisy chain 950. The first end and second end of each daisy chain 950 may be coupled to ground.

Using the open and short detection daisy chain configuration 958, open and shorted connections may be detected on each of the daisy chains 950 by applying a different bias voltage 954 to each of the daisy chains 950. For example, a first bias voltage 954*a* may be applied to a first end of the first daisy chain 950*a*, a second bias voltage 954*b* may be applied to a first end of the second daisy chain 950*b*, a third bias voltage 954*c* may be applied to a first end of the third daisy chain 950*c* and a fourth bias voltage 954*d* may be applied to a first end of the fourth daisy chain 950*d*. Each of the bias voltages 954 applied to the daisy chains 950 may be different voltages. A difference voltage 960 may also be applied to the second end of each of the daisy chains 950. For example, a first difference voltage 960*a* may be applied to the second end of the first daisy chain 950*a*, a second difference voltage 960*b* may be applied to the second end of the second daisy chain 950*b*, a third difference voltage 960*c* may be applied to the second end of the third daisy chain 950*c* and a fourth difference voltage 960*d* may be applied to the second end of the fourth daisy chain 950*d*. The difference voltages 960 may be different from a corresponding bias voltage 954 for the same daisy chain. For example, the difference between the first bias voltage 954*a* and the first difference voltage 960*a* may cause a current to flow from a first end of the first daisy chain 950*a* to a second end of the first daisy chain 950*a*.

A difference between the values of the bias voltages 954 and corresponding difference voltages 960 may be relatively small. Specifically, the difference between each of the bias voltages 954 may be much larger than the difference between each bias voltage 954 and the corresponding difference voltage 960 for the same daisy chain 950. For example, the difference between the first bias voltage 954*a* and the second bias voltage 954*b* may be larger than the difference between the first bias voltage 954*a* and the first difference voltage 960*a*. As an example, the difference between each subsequent bias voltage 954 on different daisy chains 950 may be 1 Volt (V) while the difference between each bias voltage 954 and corresponding difference voltage 960 on the same daisy chain 950 may be 100 millivolts (mV). By making the difference between the bias voltages 954 and corresponding difference voltages 960 relatively small, shorts may be more easily detected between different daisy chains 950. Because the difference in potential between different daisy chains 950 is substantially larger than the difference between the bias voltages 954 and corresponding difference voltages 960, a short between daisy chains 950 will cause a higher current to pass through various components on the affected daisy chains 950. If a high current is detected, then a short exists somewhere along the affected daisy chains 950. If zero current is detected, then there is an open connection somewhere along the daisy chain 950.

By using the open and short detection daisy chain configuration 958, both shorts and open circuits may be tested simultaneously. Further, each of the daisy chains 950 may be tested for shorts and open circuits simultaneously saving time and repetitive testing for each individual daisy chain 950.

Figure 10:
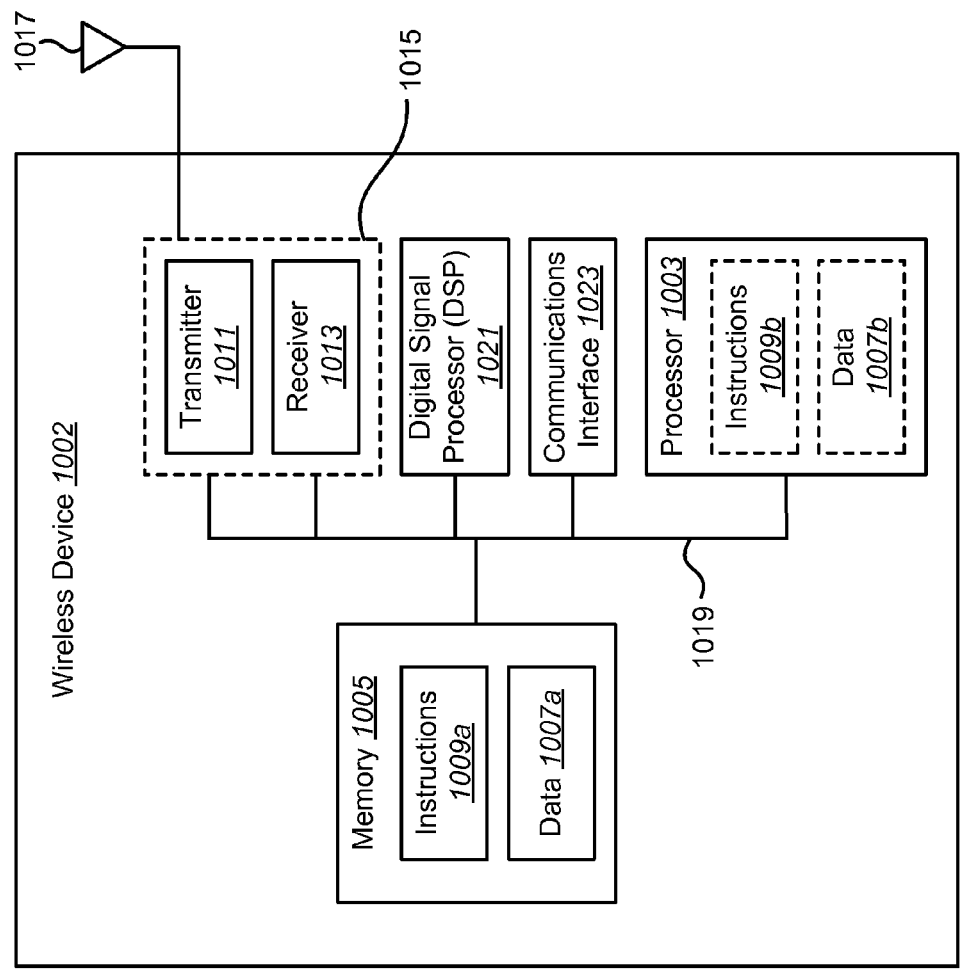
FIG. 10 illustrates certain components that may be included within a wireless device.

FIG. 10 illustrates certain components that may be included within a wireless device 1002. The wireless device 1002 may be an access terminal, a mobile station, a user equipment (UE), etc. The wireless device 1002 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the wireless device 1002 of FIG. 10, in an alternative configuration, a combination of processors (e.g., an ARM and DSP) could be used.

The wireless device 1002 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, erasable programmable read-only memory (EPROM), electrically erasable PROM (EEPROM), registers and so forth, including combinations thereof.

Data 1007*a* and instructions 1009*a* may be stored in the memory 1005. The instructions 1009*a* may be executable by the processor 1003 to implement the methods disclosed herein. Executing the instructions 1009*a* may involve the use of the data 1007*a* that is stored in the memory 1005. When the processor 1003 executes the instructions 1009, various portions of the instructions 1009*b* may be loaded onto the processor 1003, and various pieces of data 1007*b* may be loaded onto the processor 1003.

The wireless device 1002 may also include a transmitter 1011 and a receiver 1013 to allow transmission and reception of signals to and from the wireless device 1002 via an antenna 1017. The transmitter 1011 and receiver 1013 may be collectively referred to as a transceiver 1015. The wireless device 1002 may also include (not shown) multiple transmitters, multiple antennas, multiple receivers and/or multiple transceivers.

The wireless device 1002 may include a digital signal processor (DSP) 1021. The wireless device 1002 may also include a communications interface 1023. The communications interface 1023 may allow a user to interact with the electronic device/wireless device 1002.

The various components of the wireless device 1002 may be coupled together by one or more buses, which may include a power bus, a control signal bus, a status signal bus, a data bus, etc. For the sake of clarity, the various buses are illustrated in FIG. 10 as a bus system 1019.

A wireless device may be a wireless communication device or a base station. A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

A wireless device may operate in a wireless communication system that includes other wireless devices, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communication in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, 3rd Generation Partnership Project (3GPP) Long Term Evolution (LTE) systems and spatial division multiple access (SDMA) systems.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 2, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. An integrated circuit product package configured for continuity testing, comprising:
   a package substrate comprising internal routing connections; and
   a semiconductor die coupled to the package substrate, wherein the semiconductor die comprises input/output pins and switches, and wherein the switches selectively couple the input/output pins to facilitate a plurality of daisy chain connections, wherein each daisy chain connection comprises circuitry fabricated on the semiconductor die, more than two of the internal routing connections, more than two of the input/output pins and at least one switch, wherein a plurality of daisy chain connections is configured as in an open and short circuit detection configuration with each daisy chain having a first end configured to connect to a bias voltage and a second end configured to connect to a difference voltage.

2. The integrated circuit product package of claim 1, wherein the package substrate and the semiconductor die are coupled together using die interconnects, wherein at least one daisy chain connection comprises more than two of the die interconnects.

3. The integrated circuit product package of claim 2, wherein the package substrate comprises substrate interconnects on a different surface of the package substrate than the die interconnects, wherein the daisy chain connection comprises at least two of the substrate interconnects.

4. The integrated circuit product package of claim 1, wherein a top printed circuit board is coupled to the integrated circuit product package, wherein the daisy chain connection comprises components on the top printed circuit board.

5. The integrated circuit product package of claim 4, wherein the top printed circuit board is coupled to the semiconductor die using the internal routing connections.

6. The integrated circuit product package of claim 4, wherein the top printed circuit board is coupled to the package substrate using test probes.

7. The integrated circuit product package of claim 6, wherein the test probes are spring probes.

8. The integrated circuit product package of claim 1, further comprising a second semiconductor die coupled to the package substrate, wherein the second semiconductor die comprises input/output pins and switches, and wherein the daisy chain connection further comprises circuitry fabricated on the second semiconductor die, input/output pins on the second semiconductor die and at least one switch on the second semiconductor die.

9. The integrated circuit product package of claim 8, wherein the second semiconductor die is coupled to the semiconductor die using internal routing connections internal to the integrated circuit product package.

10. The integrated circuit product package of claim 1, wherein the integrated circuit product package is configured to be coupled to a loadboard using test probes.

11. The integrated circuit product package of claim 10, wherein the test probes are spring probes.

12. The integrated circuit product package of claim 10, wherein the test probes are coupled together using a loadboard contact.

13. The integrated circuit product package of claim 12, wherein the daisy chain connection further comprises the test probes and the loadboard contact.

14. The integrated circuit product package of claim 10, wherein the test probes are coupled together using multiple loadboard contacts.

15. The integrated circuit product package of claim 14, wherein the at least one daisy chain connection further comprises the test probes and the multiple loadboard contacts.

16. The integrated circuit product package of claim 15, wherein the multiple loadboard contacts are connected using internal routing on the loadboard.

17. The integrated circuit product package of claim 1, wherein the at least one daisy chain connection further comprises each of the input/output pins on the semiconductor die.

18. The integrated circuit product package of claim 1, wherein the switches selectively couple the input/output pins to facilitate multiple daisy chain connections, wherein each daisy chain connection comprises circuitry fabricated on the semiconductor die, more than two of the internal routing connections, more than two of the input/output pins and at least one switch.

19. The integrated circuit product package of claim 18, wherein each adjacent input/output pin is part of a different daisy chain connection.

20. The integrated circuit product package of claim 1, wherein the switches selectively couple the input/output pins to facilitate at least two daisy chain connections, wherein each of the two daisy chain connections comprises circuitry fabricated on the semiconductor die, more than two of the internal routing connections, more than two of the input/output pins and at least one switch.

21. The integrated circuit product package of claim 20, wherein each adjacent input/output pin is part of a different daisy chain connection.

22. The integrated circuit product package of claim 1, wherein the input/output pins are coupled together into groups of input/output pins using one or more transistors on the semiconductor die.

23. The integrated circuit product package of claim 22, wherein each of the groups of input/output pins comprises two or more input/output pins and switches for selectively shorting or disconnecting the two or more of the input/output pins within each group of input/output pins.

24. A method for generating an integrated circuit product package configured for continuity testing, comprising:
obtaining a package substrate comprising internal routing connections;
obtaining a semiconductor die, wherein the semiconductor die comprises input/output pins and switches;
coupling the package substrate to the semiconductor die using die interconnects; and
selectively coupling the input/output pins to facilitate a daisy chain connection, wherein the daisy chain connection comprises circuitry fabricated on the semiconductor die, more than two of the internal routing connections, more than two of the die interconnects, more than two of the input/output pins and at least one switch.

25. The method of claim 24, further comprising testing continuity of the semiconductor die by coupling the daisy chain connection to a test channel, applying an electrical signal to a test channel input and measuring a test channel output.

26. The method of claim 24, further comprising selectively coupling the input/output pins to facilitate multiple daisy chain connections.

27. The method of claim 26, further comprising testing continuity of the semiconductor die using open circuit detection, wherein open circuit detection comprises detecting open circuitry on each of the multiple daisy chain connections.

28. The method of claim 27, wherein detecting open circuitry on each of the multiple daisy chain connections comprises:
performing open circuit detection on a first daisy chain connection, wherein performing open circuit detection on the first daisy chain connection comprises:
coupling each end of a first daisy chain connection to a ground reference;
coupling each end of the additional multiple daisy chain connections to an open circuit;
applying a bias voltage to a first end of the first daisy chain connection; and
measuring a resistance of the first daisy chain connection; and
performing open circuit detection on each of the additional daisy chain connections.

29. The method of claim 26, further comprising testing continuity of the semiconductor die using short circuit detection, wherein short circuit detection comprises detecting shorts on each of the multiple daisy chain connections.

30. The method of claim 29, wherein detecting shorts on each of the multiple daisy chain connections comprises:
performing short detection on a first daisy chain connection, wherein performing short detection on the first daisy chain connection comprises coupling a first end of the first daisy chain connection to a ground reference;
coupling a second end of the first daisy chain connection to an open circuit;
coupling each end of the additional multiple daisy chain connections to a ground reference;
applying a bias voltage to the first end of the first daisy chain connection; and
measuring a resistance of the first daisy chain connection; and
performing short detection on each of the additional daisy chain connections.

31. The method of claim 26, further comprising testing continuity of the semiconductor die using open and short detection, wherein open and short detection comprises detecting shorts and open circuitry on each of the multiple daisy chain connections.

32. The method of claim 31, wherein detecting shorts and open circuitry on each of the multiple daisy chain connections comprises:
coupling each end of each of the multiple daisy chain connections to a ground reference;
applying a bias voltage to a first end of each of the multiple daisy chain connections; and
measuring a current across each of the multiple daisy chain connections.

33. The method of claim 32, further comprising applying a difference voltage to a second end of each of the multiple daisy chain connections, wherein the difference between a bias voltage and a difference voltage on the same daisy chain connection is less than the difference between bias voltages on different daisy chain connections.

34. The method of claim 33, wherein each adjacent input/output pin is part of a different daisy chain connection.

35. The method of claim 31, further comprising coupling the integrated circuit product package to a loadboard using test probes.

36. The method of claim 31, further comprising coupling a top printed circuit board to the integrated product package, wherein the daisy chain connection further comprises components on the top printed circuit board.

37. The method of claim 31, further comprising:
obtaining a second semiconductor die, wherein the semiconductor die comprises input/output pins and switches;
coupling the package substrate to the semiconductor die using the die interconnects and internal routing connections; and
selectively coupling the input/output pins on the second semiconductor die to input/output pins on the semiconductor die, wherein the daisy chain connection further comprises circuitry fabricated on the second semiconductor die.

38. An apparatus for generating an integrated circuit product package configured for continuity testing, comprising:
a package substrate comprising internal routing connections;
a semiconductor die coupled to the package substrate, wherein the semiconductor die comprises input/output pins; and
means for selectively coupling the input/output pins to facilitate a plurality of daisy chain connections, wherein each daisy chain connection comprises circuitry fabricated on the semiconductor die, more than two of the internal routing connections and more than two of the input/output pins, wherein a plurality of daisy chain connections is configured as in an open and short circuit detection configuration with each daisy chain having a first end configured to connect to a bias voltage and a second end configured to connect to a difference voltage.

39. The apparatus of claim 38, wherein a top printed circuit board is coupled to the apparatus, wherein the daisy chain connection further comprises components on the top printed circuit board.

40. The apparatus of claim 38, further comprising:
a second semiconductor die coupled to the package substrate, wherein the second semiconductor die comprises input/output pins; and means for selectively coupling the input/output pins on the second semiconductor die to couple the daisy chain connection to circuitry fabricated on the second semiconductor die.

41. The apparatus of claim 40, wherein the second semiconductor die is coupled to the semiconductor die using internal routing connections internal to the integrated circuit product package.

42. The apparatus of claim 38, further comprising means for selectively coupling the input/output pins to facilitate multiple daisy chain connections, wherein each daisy chain connection comprises circuitry fabricated on the semiconductor die, more than two of the internal routing connections and more than two of the input/output pins.

* * * * *